FREQUENCY DISCRIMINATOR WITH CENTER FREQUENCY CONTROL

Filed Nov. 5, 1962 2 Sheets-Sheet 1

INVENTORS.
ER-CHUN HO,
JOHN J. FAKKELDIJ,
IRVING B. MERLES,
BY Paul M. Coble
ATTORNEY.

United States Patent Office 3,170,121
Patented Feb. 16, 1965

3,170,121
FREQUENCY DISCRIMINATOR WITH CENTER FREQUENCY CONTROL

Er-chun Ho, Newport Beach, John J. Fakkeldij, Huntington Beach, and Irving B. Merles, Costa Mesa, Calif., assignors to Hughes Aircraft Company, Culver City, Calif., a corporation of Delaware Filed Nov. 5, 1962, Ser. No. 235,420
1 Claim. (Cl. 329—117)

This invention relates to the detection of frequency modulated signals, and more particularly relates to a crystal frequency discriminator in which the center frequency may be varied during operation in response to a control signal.

Discriminator networks employing piezoelectric crystals as frequency sensitive impedance elements have been useful in many applications on account of their stability, high sensitivity, and small power dissipation. However, in many instances it becomes necessary to alter the center frequency of the discriminator during operation, for example in response to a signal from a servomechanism. The center frequency of most prior art crystal discriminators is fixed during operation, and any adjustments in center frequency must be made mechanically during maintenance or service periods.

In addition, the center frequency of prior art crystal discriminator networks often drifts due to aging of the crystal and other circuit components or on account of extreme changes in environmental conditions. In order to ensure reliable operation at all times, center frequency correction is required.

Accordingly, it is an object of the present invention to provide a frequency discriminator in which electronic means are provided for varying the center frequency during operation of the discriminator.

It is a further object of the present invention to provide a high Q, wide band discriminator circuit for the detection of frequency modulated signals, and in which the center frequency of the discriminator may be continuously adjusted in accordance with a control program to either maintain the center frequency constant despite varying environmental conditions or alter the center frequency in a desired manner.

It is a still further object of the present invention to provide a highly stable and reliable piezoelectric crystal discriminator network with a readily and rapidly controllable center frequency.

In accordance with the foregoing objectives, the frequency discriminator circuit of the present invention comprises a frequency sensitive signal processing network including a piezoelectric element for developing an output signal having an amplitude indicative of the instantaneous frequency deviation of the input signal from a center frequency. Variable capacitance means is provided in the signal processing network for varying its frequency response characteristics in accordance with an electrical control signal in a manner which effectively varies the center frequency of the discriminator.

In one embodiment of the invention a pair of frequency sensitive signal processing channels are provided, each including a piezoelectric element. The frequency modulated input signal is applied simultaneously to both of the signal processing channels, and the output signals from the respective channels are algebraically combined to produce a net output signal indicative of the frequency modulation of the input signal. Variable capacitance means are provided in each of the signal processing channels for varying at least one characteristic frequency thereof, and a control signal is applied to each variable capacitance means to vary its capacitance, thereby varying the center frequency of the discriminator.

Other and further objects, advantages, and characteristic features of the present invention will become readily apparent from the following detailed description of a preferred embodiment of the invention when taken in conjunction with the appended drawings in which.

Figure 2:
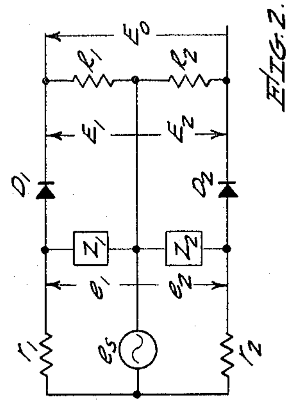
FIG. 2 is a simplified equivalent of the circuit of FIG. 1 used in explaining the principles of the present invention.
Figure 3:
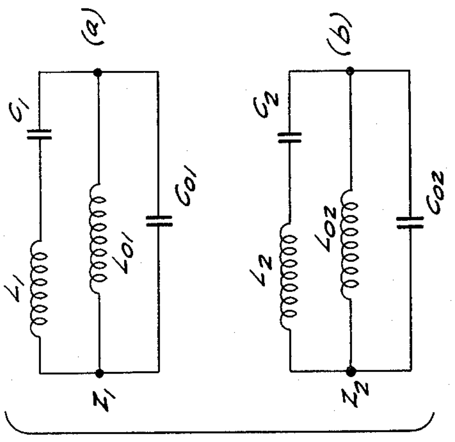
Figure 8:
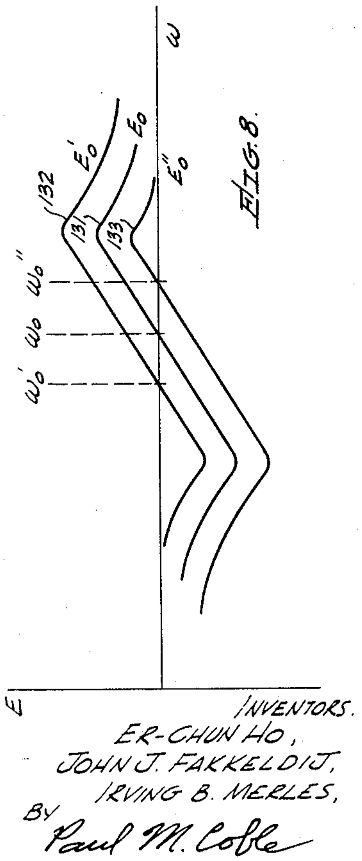
Figure 4:
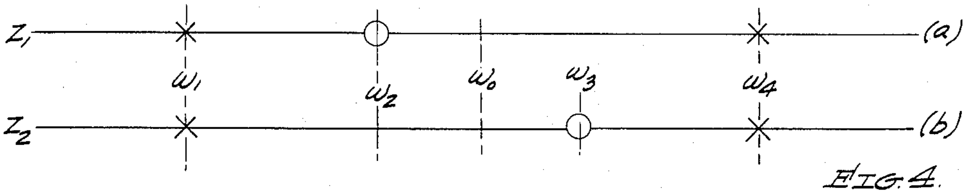
Figures 5, 6, 7:
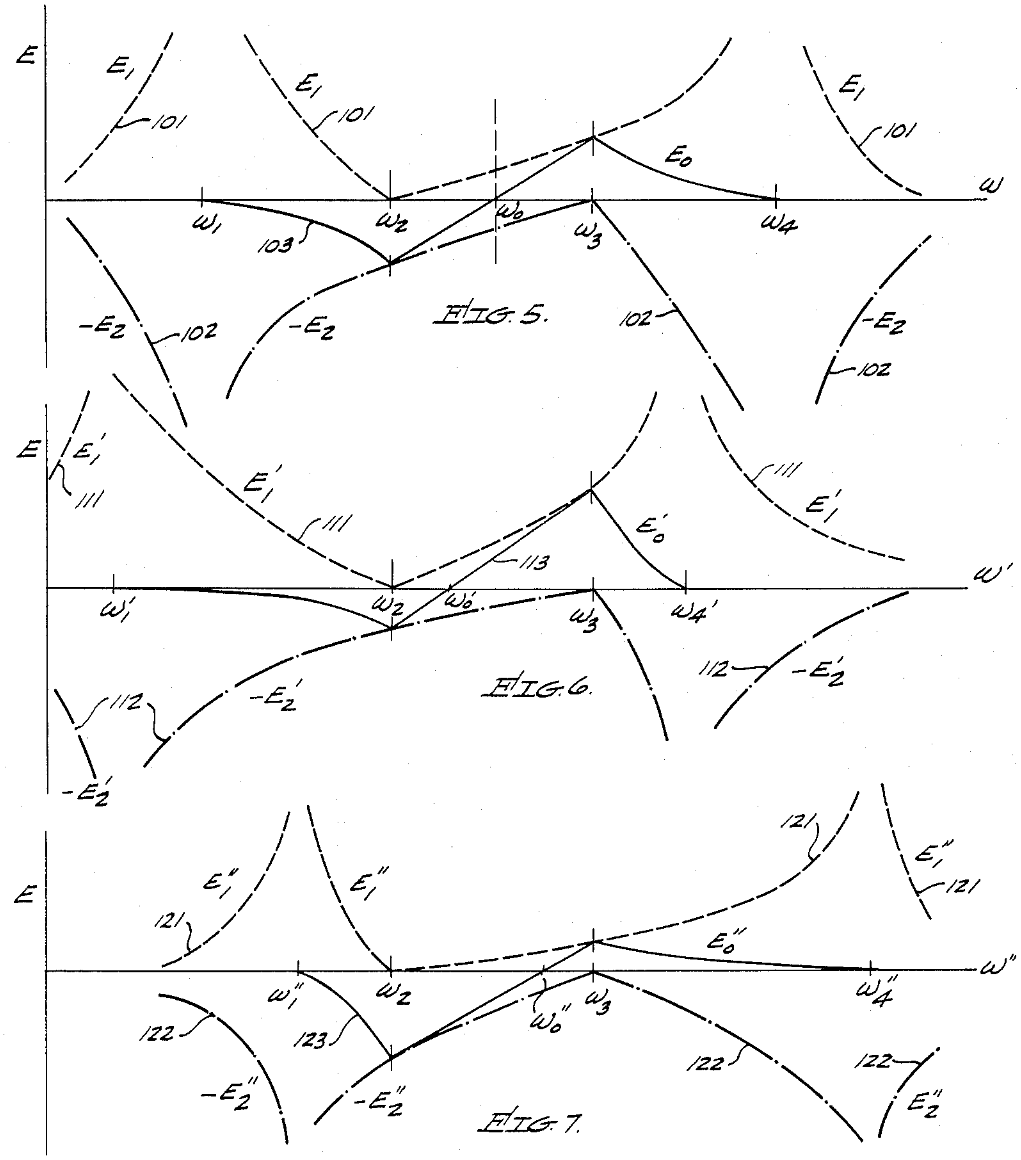

FIGS. 3(*a*) and (*b*) illustrate equivalent circuits for the respective impedances $Z_1$ and $Z_2$ of FIG. 2;

FIGS. 4(*a*) and (*b*) are pole-zero plots for the respective impedances $Z_1$ and $Z_2$ for positive values of frequency:

FIGS. 5, 6, and 7 are graphs of voltage vs. frequency, with each figure illustrating the output voltage $E_0$ and its components $E_1$ and $E_2$ for a particular value of control voltage; and FIG. 8 is a voltage vs. frequency graph summarizing FIGS. 5–7 to better illustrate the variation in center frequency as a function of control voltage.

Figure 1:
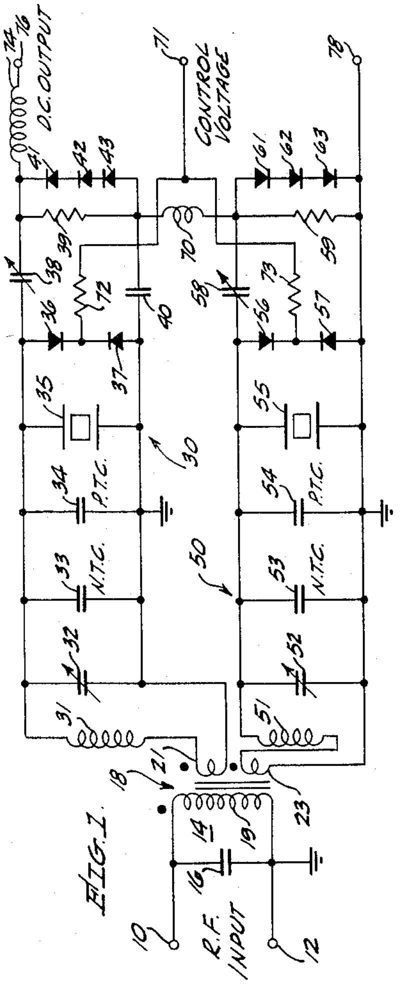
FIG. 1 is a schematic circuit diagram of a frequency discriminator circuit provided in accordance with the present invention.

Referring now to the drawings, and in particular to FIG. 1, the discriminator circuit of the present invention will be described in more detail. The discriminator circuit comprises a pair of similar signal processing channels, or paths, 30 and 50. These channels are independently operating frequency sensitive impedance networks, individually grounded with respect to alternating current, but providing direct current output signals in series.

A frequency modulated R.F. input signal is applied to the circuit of FIG. 1 by means of input terminals 10 and 12, the latter being grounded. The terminals 10 and 12 are connected to respective ends of an input tank circuit 14 consisting of a capacitor 16 connected in parallel with primary winding 19 of a transformer 18. The transformer 18 has a pair of identical secondary windings 21 and 23, each feeding one channel of the dual channel discriminator circuit, with the polarity of the signals induced in the windings 21 and 23 being indicated in the conventional manner by the dots adjacent the windings 19, 21, and 23. The transformer input feeding arrangement enables the stability of the discriminator circuit to be improved.

In signal processing channel 30, an inductor 31 is connected in series with the secondary winding 21 of the transformer 18 to provide a desired overall value of inductance. The non-dotted end of the secondary winding 21 is grounded to provide an alternating current ground for the channel 30. A mechanically variable capacitor 32 is connected across the series arrangement of the coils 21 and 31 to enable capacitance adjustments to be made during service or maintenance of the discriminator circuit. A negative temperature coefficient capacitor 33 and a positive temperature coefficient capacitor 34 are each connected in parallel with the variable capacitor 32, the temperature coefficients of the capacitors 33 and 34 being such that the overall temperature coefficient for the tank circuit consisting of the coils 21 and 31 and the capacitors 32, 33, and 34 is as close to zero as possible. A piezoelectric element 35, which in a preferred embodiment of the present invention may be a quartz crystal, is connected in parallel with the capacitors 32, 33, and 34.

A pair of semiconductor diodes 36 and 37 of the varactor, or variable capacitance, type are connected in series, cathode-to-cathode, and in parallel with the piezoelectric element 35. These diodes provide in parallel with the piezoelectric element 35 a capacitance which may be varied in response to variations in applied voltage. As is well known, a varactor diode consists of a p-zone anode containing positive charge carriers, an n-zone cathode having negative charge carriers, and a thin depletion zone between the p and n zones with relatively few charge carriers. When such a diode is biased such that the potential of the anode is positive with respect to that of the cathode, the diode is in a forward biased condition, and charge carriers act to bridge the depletion zone and form a conductive path through the diode. When the applied potential is reversed, the diode is in a back biased state, with the depletion zone insulating the p and n regions of the diode from one another. It is primarily in this back biased condition that the diode acts as a variable capacitance, although capacitive effects are also present for very small values of forward bias potential. The back bias across the diode causes the charge carriers to be pulled away from the depletion zone, with the greater the potential across the diode, the further the charge carriers are removed from the depletion zone and the lower is the capacitance of the diode. Thus, the capacitance may be varied simply by changing the voltage across the diode. An example of specific devices which may be employed as the diodes 36 and 37 in the circuit FIG. 1 are type IN951 silicon capacitors manufactured by Hughes Aircraft Co., Semiconductor Division, Newport Beach, California. It is pointed out, however, that although a preferred embodiment of the invention employs varactor diodes to provide the requisite variable capacitance in parallel with the piezoelectric element 35, other variable capacitance devices which possess a sufficiently high Q may be used instead.

As will be more fully explained below the coils 21 and 31, the capacitors 32, 33, and 34, the piezoelectric element 35, and the variable capacitance diodes 36 and 37 form a frequency sensitive impedance network, the impedance of which varies in accordance with the ferquency of the input signal. This frequency sensitive impedance network is coupled to a rectifying device via a mechanically variable coupling capacitor 38 which affords a sensitivity control for the channel 30 and also matches the output level of the channel 30 with that of the channel 50. Rectification of the A.C. signal developed by the impedance network is accomplished by rectifier diodes 41, 42 and 43 connected in series in like polarity, with the cathode of the diode 41 being connected to the end of variable capacitor 38 remote from the varactor diode 36. The diodes 41, 42 and 43 may be conventional rectifier diodes, and although three diodes are illustrated in FIG. 1 and have been used in a preferred embodiment of the invention, one, two, or more than three diodes may also be employed. The anode of the diode 43 is coupled to the anode of varactor diode 37 by means of a capacitor 40 which not only furnishes an A.C. return for the channel 30, but which also provides D.C. isolation between the output circuit and the ground lead of the channel 30. A resistor 93 is connected in parallel with the series arrangement of rectifier diodes 41, 42, and 43 to furnish the component of the output signal developed by the channel 30.

The second signal processing channel 50 is similar to the aforedescribed channel 30 and comprises an indicator 51, a mechanically variable capacitor 52, negative and positive temperature coefficient capacitors 53 and 54, respectively, a piezoelectric element 55, and variable capacitance diodes 56 and 57, all similar to and connected in the same manner as their counterpart elements in the channel 30, with the corresponding elements in the respective channels being designated by the same second reference numeral digit. The values for the elements in the channel 50 may be different from those of their corresponding elements in the channel 30 so long as certain relationships (which will be given below) are satisfied. The non-dotted end of the secondary winding 23 feeding the channel 50 is grounded to provide an alternating current ground for the channel 50 as well as a direct current ground for the common output circuit.

The elements 23 and 51–57 of the channel 50 form a second frequency sensitive impedance network providing an impedance which varies in magnitude as a function of the input signal frequency. A series arrangement of rectifier diodes 61, 62, and 63, similar to the diodes 41, 42, and 43 of the channel 30, is provided to rectify the A.C. signal developed by the frequency sensitive impedance network of channel 50. However, unlike the channel 30, the cathodes of the diodes 61, 62, and 63 face ground in the channel 50. A resistor 59 is connected across the diodes 61, 62, and 63 to provide the component of the output signal developed by the channel 50, and a mechanically variable coupling capacitor 58, similar to the capacitor 38 of the channel 30, is connected between the anode of rectifier diode 61 and the anode of varactor diode 56 to afford a sensitivity control for the channel 50 and match the output level of the channel 50 with that of the channel 30.

The resistors 39 and 59 are interconnected by means of a coil 70 so that a series circuit is provided in which the respective voltages developed across the resistors 39 and 59 may be algebraically combined to form an output voltage. The output voltage is provided across D.C. output terminals 76 and 78, with the output terminal 76 being coupled to the cathode of the diode 41 through a choke coil 74, and the output terminal 78 being connected to the ground lead in the channel 50.

As has been mentioned above, the center frepuency of the discriminator circuit of the present invention may be varied during operation of the circuit in accordance with a control voltage. This control voltage is applied to a control terminal 71, which in turn is connected via a resistor 72 to the junction between the cathodes of varactor diodes 36 and 37 in the channel 30, and through a similar resistor 73 to the junction between the cathodes of varactor diodes 56 and 57 in the channel 50. The resistors 72 and 73 isolate the control voltage from the remainder of the circuit.

For purposes of explanation, the circuit of FIG. 1 may be represented by the schematic diagram of FIG. 2. It is to be understood that the circuit illustrated in FIG. 2 is not an identical equivalent for the circuit of FIG. 1; FIG. 2 merely presents a simplified equivalent which facilitates analysis of the operation of the circuit of the present invention. In FIG. 2 the alternating source $e_s$ represents the like frequency modulated input signals developed in the secondary windings 21 and 23 of the transformer 18 of FIG. 1. The resistor $r_1$ represents the inherent resistance of the secondary winding 21 and the inductor 31 and other series resistance in the channel 30; while similarly, the resistor $r_2$ represents the inherent series resistance in the secondary winding 23 and inductor 51 as well as other series resistance in the channel 50. The net inductance and capacitance of the coils 21 and 31, the capacitors 32, 33, and 34, the piezoelectric element 35, and the varactor diodes 36 and 37 is represented by the impedance $Z_1$, while the impedance $Z_2$ is used as an equivalent for the inductance and capacitance of the elements 23 and 51–57 of channel 50. The voltages $e_1$ and $e_2$ represent the A.C. voltages developed across the respective impedance networks $Z_1$ and $Z_2$. The diode $D_1$ is used as an equivalent for the rectifier arrangement consisting of the diodes 41, 42, and 43; while the diode $D_2$ represents the rectifier arrangement comprising the diodes 61, 62, and 63. The resistance of the resistor 39 and other parallel resistance at the output of the channel 30 is designated by the resistor $R_1$, while the resistor $R_2$ represents the resistance of resistor 59 and other parallel resistance at the output of channel 50. The rectified output voltages of the respective channels 30 and 50 are indicated by the voltages $E_1$ and $E_2$, with the net output voltage (the algebraic sum of the components $E_1$ and $E_2$) appearing across the terminals 76 and 78 being designated by $E_o$.

Equivalent circuits for the respective impedances $Z_1$ and $Z_2$ of FIG. 2 are illustrated in FIGS. 3(*a*) and 3(*b*). In FIG. 3(*a*) and $L_1$ and $C_1$ represent the inductance and series capacitance, respectively, inherent in the piezoelectric element 35, $L_{01}$ represents the inductance of the coils 21 and 31, and $C_{01}$ represents the net parallel capacitance of the impedance $Z_1$ including the capacitance of capacitors 32, 33, and 34, the shunt capacitance of the piezoelectric element 35, and the capacitance of the varactor diodes 36 and 37. Similarly, in FIG. 3(*b*), the quantities $L_2$ and $C_2$ represent, respectively, the inductance and series capacitance of piezoelectric element 55, $L_{02}$ represents the inductance of the coils 23 and 51, and $C_{02}$ represents the net parallel capacitance including that of capacitors 52, 53, and 54, as well as the shunt capacitance of the piezoelectric element 55 and the capacitance of the diodes 56 and 57.

The impedances $Z_1$ and $Z_2$ may be expressed as a function of the applied frequency by the following equations:

$$Z_1=\frac{(-\omega^2)(\omega_2^2-\omega^2)}{j\omega C_{01}(\omega_1^2-\omega^2)(\omega_4^2-\omega^2)} \quad (1)$$

$$Z_2=\frac{(-\omega^2)(\omega_3^2-\omega^2)}{j\omega C_{02}(\omega_1^2-\omega^2)(\omega_4^2-\omega^2)} \quad (2)$$

where $\omega_2$ and $\omega_3$ are defined by:

$$\omega_2^2=\frac{1}{L_1C_1} \quad (3)$$

$$\omega_3^2=\frac{1}{L_2C_2} \quad (4)$$

and $\omega_1$ and $\omega_4$ may be determined from the equations:

$$\omega_1^2\omega_4^2=\frac{1}{L_1C_1L_{01}C_{01}}=\frac{1}{L_2C_2L_{02}C_{02}} \quad (5)$$

$$\omega_1^2+\omega_4^2=\frac{1}{L_1C_1}+\frac{1}{L_{01}C_{01}}+\frac{1}{L_1C_{01}}=\frac{1}{L_2C_2}+\frac{1}{L_{02}C_{02}}+\frac{1}{L_2C_{02}} \quad (6)$$

The manner in which the impedances $Z_1$ and $Z_2$ vary as a function of frequency may be better appreciated by making reference to the pole-zero plots shown in FIGS. 4(*a*) and 4(*b*) for positive values of the frequency $\omega$. From Equation 1 and FIG. 4(*a*) it may be observed that the impedance $Z_1$ has poles at $\omega_1$ and $\omega_4$ and a zero at $\omega_2$, while from Equation 2 and FIG. 4(*b*) it becomes apparent that the impedance $Z_2$ posesses a zero at $\omega_3$ and poles at $\omega_1$ at $\omega_4$. The frequencies $\omega_2$ and $\omega_3$, at which the zeros of $Z_1$ and $Z_2$ occur, are determined solely by the inductance and capacitance characteristics of the piezoelectric elements 35 and 55, respectively, and remain at fixed values during operation of the circuit. Therefore, it is necessary that the piezoelectric elements 35 and 55 be sufficiently different so that their zeros occur at different values of frequency. The frequencies at which the poles of $Z_1$ and $Z_2$ occur are determined not only by the inductance and capacitance of the piezoelectric elements, but also by the parallel inductance and capacitance furnished by the other circuit elements constituting the impedances $Z_1$ and $Z_2$, and it is these pole frequencies which are varied during the operation of the circuit by varying the capacitance of the varactor diodes 36, 37, 56 and 57. It is pointed out that the pair of poles of $Z_1$ and $Z_2$ at the frequency $\omega_1$ remain essentially coincident even though $\omega_1$ is varied during the operation of the circuit. Similarly, the other poles of $Z_1$ and $Z_2$ remain essentially coincident at $\omega_4$ although $\omega_4$ assumes different values during operation of the circuit.

The magnitude of the impedance $Z_1$ thus varies as a function of the instantaneous frequency of the frequency modulated signal in the channel 30, approaching zero at the frequency $\omega_2$ and becoming quite large at the frequencies $\omega_1$ and $\omega_4$. The magnitude of the impedance $Z_2$ of the channel 50 varies with frequency in a similar manner, becoming quite large at the frequencies $\omega_1$ and $\omega_4$, and tending toward zero at the frequency $\omega_3$. The voltage $E_1$, which is the voltage across the impedance $Z_1$ after being rectified by the diode $D_1$, is proportional to the magnitude of the impedance $Z_1$ and is depicted by the dashed curve 101 in FIG. 5. Similarly, the rectified voltage $E_2$, illustrated by the dashed curve 102 of FIG. 5, is proportional to the magnitude of the impedance $Z_2$. The resultant output voltage $E_o$, which in accordance with the polarity definitions of FIG. 2 is equal to $E_1-E_2$, is indicated by the solid curve 103 of FIG. 5. It may be seen that the output voltage $E_o$ is zero at $\omega_1$, decreases to its maximum negative value at $\omega_2$, then increases essentially linearly between $\omega_2$ and $\omega_3$, reaches its maximum positive value at $\omega_3$, after which it decreases to zero at $\omega_4$. The discriminator circuit is operated in the linear region of the $E_o$ curve, i.e. between $\omega_2$ and $\omega_3$, and the center frequency $\omega_o$ of the circuit is that frequency in this region at which the output voltage $E_o$ is zero. Thus, in response to a frequency modulated input signal, the discriminator circuit produces an output voltage $E_o$ with an amplitude proportional to the instantaneous frequency deviation of the input signal from the center frequency $\omega_o$.

When it is desired to vary the center frequency $\omega_o$ of the discriminator circuit during the operation of the circuit, the control voltage applied to the terminal 71 of FIG. 1 is altered. This control voltage may be derived, for example, from a servomechanism driven by the output signal from the discriminator so that a feedback arrangement is provided which continually corrects the center frequency $\omega_o$ to a desired value. Alternately, the control voltage applied to the terminal 71 may be obtained from a signal source programmed in a predetermined manner.

Upon varying the control voltage applied to the terminal 71, the bias across the variable capacitance diodes 36, 37, 56 and 57 is altered, thereby changing the capacitance of these diodes. For a given increase in control voltage, the capacitance of the diodes 36 and 37 will increase by an amount $\Delta C_0$. This increase in capacitance causes $C_{01}$ to increase, which in turn shifts the two poles of $Z_1$ to lower frequencies, as will be apparent from Equations 5 and 6. The capacitance of the diodes 56 and 57 is also increased by $\Delta C_0$, and the two poles of $Z_2$ are also shifted to lower frequencies. Since the frequency separation between the poles at $\omega_1$ and $\omega_4$ is small in comparison with the center frequency $\omega_o$, i.e. $(\omega_4-\omega_1)/\omega_0\leqq .01$, a small change $\Delta C_0$ in both $C_{01}$ and $C_{02}$ will result in approximately equal changes in the impedances $Z_1$ and $Z_2$, and their respective poles of these two impedances will remain essentially aligned in frequency even though the frequency at which they occur varies.

Thus, when the capacitances $C_{01}$ and $C_{02}$ increase by $\Delta C_0$, the poles of $Z_1$ and $Z_2$ occur at slightly lower frequencies $\omega_1'$ and $\omega_4'$ with the zeros of $Z_1$ and $Z_2$ remaining at $\omega_2$ and $\omega_3$, respectively. The output voltages for this modified pole condition is illustrated in FIG. 6. The dashed curve 111 represents the new rectified voltage $E_1'$, the dashed curve 112 illustrates the modified rectified voltage $E_2'$, and the solid curve 113 designates the modified net output voltage $E_o'$. It will be observed that the linear portion of the output voltage curve 113 crosses the zero volt axis at a frequency $\omega_o'$ which is lower than $\omega_o$.

When the change in control voltage applied to the terminal 71 is of the opposite polarity from that discussed above, a decrease in the capacitance of the diodes 36, 37, 56 and 57 occurs, causing the capacitances $C_{01}$ and $C_{02}$ to decrease by an amount $\Delta C_0$. This shifts the poles of $Z_1$ and $Z_2$ upwardly in frequency to $\omega_1''$ and $\omega_4''$, with the zero of $Z_1$ remaining at $\omega_2$ and the zero of $Z_2$ remaining at $\omega_3$. The rectified voltages across $Z_1$ and $Z_2$ for this pole condition are illustrated in FIG. 7 by the dashed curves 121 and 122, respectively, with the output voltage $E_o''$ being shown by the solid curve 123. The linear portion of the $E_o''$ curve crosses the zero volt axis at a frequency $\omega_o''$ greater than $\omega_o$.

A summary of the manner in which the output voltage varies in accordance with the control voltage applied to terminal 71 is presented in FIG. 8. The curves 131, 132, and 133 illustrates the respective output voltages $E_o$, $E_o'$, and $E_o''$ for control voltages changing the capacitances $C_{01}$ and $C_{02}$ by zero, $+\Delta C_0$, and $-\Delta C_0$, respectively. It will be observed from FIG. 8 that the respective points at which the curves 131, 132 and 133 cross the zero volt axis occur at the frequencies $\omega_0$, $\omega_0'$, and $\omega_0''$. Since by definition these values of frequency are center frequencies for the discriminator circuit, the center frequency of the discriminator circuit is thus seen to vary in accordance with the control voltage. It is further pointed out that shifting of the output voltage curves of FIG. 8 in response to changes in control voltage may alternately be visualized as simply a change in the level of the output voltage.

Although the present invention has been shown and described with reference to a particular embodiment, various changes and modifications obvious to one skilled in the art to which the invention pertains may be made therein without departing from the spirit, scope, and contemplation of the invention.

What is claimed is:

A discriminator circuit for providing a unidirectional output voltage indicative of the instantaneous frequency deviation of a frequency modulated input signal from a center frequency comprising: a transformer having a primary winding and first and second secondary windings, means for applying said frequency modulated input signal to said primary winding, a first inductor connected in series with said first secondary winding, a second inductor connected in series with said second secondary winding, at least a first capacitor connected across said first secondary winding and said first inductor, at least a second capacitor connected across said second secondary winding and said second inductor, a first quartz crystal connected across said first capacitor, a second quartz crystal connected across said second capacitor, a first pair of variable capacitance semiconductor diodes connected in series in opposite polarity across said first quartz crystal, a second pair of variable capacitance semiconductor diodes connected in series in opposite polarity across said second quartz crystal, a first variable coupling capacitor connected to one of said first pair of semiconductor diodes, a second variable coupling capacitor connected to one of said second pair of semiconductor diodes, a first plurality of rectifier diodes connected in series in like polarity to said first variable coupling capacitor, a second plurality of rectifier diodes connected in series in like polarity to said second variable coupling capacitor, a third capacitor connected between the other of said first pair of semiconductor diodes and the end of said first plurality of rectifier diodes remote from said first variable coupling capacitor, an output circuit including a first resistor and a second resistor connected in series, said first resistor being connected across said first plurality of rectifier diodes, said second resistor being connected across said second plurality of rectifier diodes, a control terminal, a third resistor connected between said control terminal and the junction between said first pair of semiconductor diodes, and a fourth resistor connected between said control terminal and the junction between said second pair of semiconductor diodes, said third and fourth resistors being adapted to apply a control voltage to said first and second pairs of semiconductor diodes to vary the capacitances thereof, whereby said center frequency is effectively altered in accordance with said control voltage.

References Cited by the Examiner

UNITED STATES PATENTS

| | | | |
|---|---|---|---|
| 2,607,890 | 8/52 | Petroff | 329—117 |
| 3,050,693 | 8/62 | Sinninger | 332—30 |
| 3,074,021 | 1/63 | Rullman | 329—117 |

ROY LAKE, *Primary Examiner.*

UNITED STATES PATENT OFFICE

CERTIFICATE OF CORRECTION

Patent No. 3,170,121 February 16, 1965

Er-chun Ho et al.

It is hereby certified that error appears in the above numbered patent requiring correction and that the said Letters Patent should read as corrected below.

Column 3, line 20, after "circuit" insert -- of --; line 32, for "ferquency" read -- frequency --; line 52, for "93" read -- 39 --; line 56, for "indicator" read -- inductor --; column 5, line 43, for "at", second occurrence, read -- and --; column 6, line 73, for "illustrates" read -- illustrate --.

Signed and sealed this 27th day of July 1965.

(SEAL)
Attest:

ERNEST W. SWIDER
Attesting Officer

EDWARD J. BRENNER
Commissioner of Patents